United States Patent
Kim et al.

(10) Patent No.: US 6,802,037 B2
(45) Date of Patent: Oct. 5, 2004

(54) ITERATIVE DECODING METHOD FOR BLOCK TURBO CODES OF GREATER THAN THREE DIMENSIONS

(75) Inventors: Sooyoung Kim, Daejeon (KR); Woo-Seok Yang, Daejeon (KR); Ho-Jin Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 462 days.

(21) Appl. No.: 10/028,273

(22) Filed: Dec. 28, 2001

(65) Prior Publication Data

US 2003/0056166 A1 Mar. 20, 2003

(30) Foreign Application Priority Data

Sep. 14, 2001 (KR) .......................... 2001-56774

(51) Int. Cl.[7] .......................... H03M 13/00; H03D 1/00
(52) U.S. Cl. .......................... 714/755; 714/780; 375/341
(58) Field of Search .......................... 714/755, 780, 714/795; 375/341

(56) References Cited

U.S. PATENT DOCUMENTS

| 5,181,209 A | 1/1993 | Hagenauer et al. | |
| 5,446,747 A | 8/1995 | Berrou | |
| 5,563,897 A | 10/1996 | Pyndiah et al. | |
| 6,122,763 A | * 9/2000 | Pyndiah et al. | 714/755 |
| 6,421,804 B1 | * 7/2002 | Lee | 714/755 |
| 6,557,139 B2 | * 4/2003 | Bohnke | 714/758 |
| 6,581,182 B1 | * 6/2003 | Lee | 714/795 |
| 6,629,286 B1 | * 9/2003 | Berens et al. | 714/755 |

FOREIGN PATENT DOCUMENTS

| KR | 1999-35893 | 8/1999 | |
| KR | 10-2001-0019469 | 3/2001 | ............ H04N/7/50 |

OTHER PUBLICATIONS

Joachim Hagenauer, et al.; "Iterative Decoding of Binary Block And Convolutional Codes"; IEEE Transactions on Information Theory, vol. 42, No. 2; Mar. 1996; pp. 429–445.

\* cited by examiner

Primary Examiner—Albert Decady
Assistant Examiner—Esaw Abraham
(74) Attorney, Agent, or Firm—Jacobson Holman PLLC

(57) ABSTRACT

Disclosed is an iterative decoding method using a soft decision output Viterbi algorithm (SOVA) for block turbo codes using product codes wherein block codes are concatenated by greater than three dimensions, which comprises: (a) a transmitter configuring a product code of greater than three dimensions and transmitting it; (b) configuring the signal transmitted by the transmitter into frames for decoding, and initializing external reliability information respectively corresponding to an axis corresponding to the product code of greater than three dimensions; and (c) sequentially iterating the soft decision output Viterbi algorithm (SOVA) decoding with respect to the respective axes.

9 Claims, 2 Drawing Sheets

ITERATIVE DECODING METHOD FOR BLOCK TURBO CODES OF GREATER THAN THREE DIMENSIONS

BACKGROUND OF THE INVENTION (a) Field of the Invention

The present invention relates to an iterative decoding method for block turbo codes of greater than three dimensions. More specifically, the present invention relates to a method for performing iterative decoding on a product code of block codes and dimensions of greater than three dimensions, using a soft output Viterbi algorithm (SOVA).

(b) Description of the Related Art

U.S. Pat. No. 5,563,897 discloses an iterative decoding method for a product code of a block code generally referred to as a block turbo code using a soft decision output, characterized in that a soft decision output is calculated by an algebraic method and iterative decoding is executed using this. However, this technique has a demerit of requiring an additional task for providing the soft decision output.

Korean laid-open patent publication no. 2001-19469 discloses an iterative decoding method applying a less complex SOVA to block codes, characterized in that it reduces complexity of 2 dimensional block turbo codes (i.e. 2 block codes are serially concatenated), but it does not provide an application method for generating sufficient performance on block turbo codes produced with greater than three dimensions.

SUMMARY OF THE INVENTION

It is an object of the present invention to provide an iterative decoding method for the block turbo codes of greater than three dimensions for performing decoding on each axis and concurrently using soft decision output information calculated from all other axes as external reliability information, and normalizing a soft decision output to perform the iterative decoding.

In one aspect of the present invention, an iterative decoding method using a soft decision output Viterbi algorithm for block turbo codes using product codes wherein block codes are concatenated by greater than three dimensions, comprises: (a) a transmitter configuring a product code of greater than three dimensions and transmitting it; (b) configuring the signal transmitted by the transmitter into frames for decoding, and initializing external reliability information respectively corresponding to an axis corresponding to the product code of greater than three dimensions; and (c) sequentially iterating the soft decision output Viterbi algorithm decoding with respect to the respective axes, wherein (c) comprises: (1) calculating external reliability information to be used for a predetermined axis with reference to the predetermined axis on the basis of external reliability information calculated from other axes; (2) performing a decoding process using the external reliability information of the predetermined axis calculated in (1), and calculating soft decision output information; (3) calculating external reliability information corresponding to the predetermined axis to be used at a next stage on the basis of the soft decision output information calculated in (2), the external reliability information of the predetermined axis calculated in (1), and the received channel reliability information; (4) determining whether an iterative decoding stopping condition is satisfied; (5) stopping the iteration decoding and outputting decoding results when the iterative decoding stopping condition determined in (4) is satisfied; and (6) normalizing the external reliability information of each axis when the iterative decoding stopping condition determined in (4) is not satisfied.

The external reliability information $Le(u_i)$ to be used for the predetermined axis in (1) satisfies the following equation:

$$Le(u_i) = \sum_{j=1(j \neq i)}^{m} Le(u_j)'$$

where "m" represents the number of existing dimensions (m≧3), "i" represents the predetermined axis, and "$Le(u_j)'$" represents the external reliability information calculated from the j-axis decoding.

The external reliability information $Le(u_i)'$ corresponding to the predetermined axis to be used for another axis decoding to be performed after the predetermined axis decoding in (3) satisfies the following equation:

$$Le(u_i)' = L(u_i)' - Le(u_i) - L(u)$$

where "i" represents the predetermined axis, "$L(u_i)'$" represents the i-axis soft decision output information, and "$L(u)$" represents the received channel reliability information.

The normalization constant C in (B) satisfies the following equation:

$$C = 2m_{|Le(u_c)'|}/\sigma_{Le(u_c)'}$$

where "$m_{|Le(u_c)'|}$" represents the mean of absolute values of external reliability information, and "$\sigma_{Le(u_c)'}$" represents the standard deviation of absolute values of external reliability information.

In another aspect of the present invention, a computer-readable recording medium for embodying programs executable by a computer for performing an iterative decoding method for block turbo codes of greater than three dimensions, the iterative decoding method comprises: (a) a transmitter configuring a product code of greater than three dimensions and transmitting it; (b) configuring the signal transmitted by the transmitter into frames for decoding, and initializing external reliability information respectively corresponding to axes corresponding to the product code of greater than three dimensions; and (c) sequentially iterating a soft decision output Viterbi algorithm decoding with respect to the axes, wherein (c) comprises: (1) calculating external reliability information to be used for a predetermined axis with respect to the predetermined axis on the basis of external reliability information calculated from other axes; (2) performing a decoding using the external reliability information of the predetermined axis calculated in (1), and calculating soft decision output information; (3) calculating external reliability information corresponding to the predetermined axis to be used at a subsequent stage on the basis of the soft decision output information calculated in (2), external reliability information of the predetermined axis calculated in (1), and the received channel reliability information; (4) determining whether an iteration decoding stop condition is satisfied; (5) stopping the iterative decoding and outputting decoding results when the iteration decoding stop condition determined in (4) is satisfied; and (6) normalizing external reliability information of each axis when the iteration decoding stop condition determined in (4) is not satisfied.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

The method for iteratively decoding the block turbo codes of greater than three dimensions will now be described with reference to drawings.

Initially, the method for iteratively decoding the block codes by applying the SOVA disclosed in the Korea laid-open patent publication no. 2001-19469 is as follows.

First, all path information at the $r^{th}$ point of the code trellis for an (n, k) block code is calculated and recorded.

Second, a surviving path at each node is selected. The first and second processes are performed in a general Viterbi algorithm.

Third, a reliability that is a metric difference value between a survival path and a contending path is stored. This reliability subsequently becomes a soft decision output value.

Fourth, reliability values stored in the path from the $0^{th}$ to $(r-1)^{th}$ point of a trellis are compared with a reliability value of a current contending path, and the reliability value is updated through the following Equation 4.

$$\text{if } u_j^s \neq u_j^c \text{ then } L_j^s = \min(L_j^s, \Delta_r^m)$$

$$\text{if } u_j^s = u_j^c \text{ then } L_j^s = \min(L_j^s, \Delta_r^m + L_j^c) \quad \text{Equation 4}$$

where $\Delta_r^m$, represents a metric difference value between a surviving path and a contending path, each merging to the state m of the trellis at the $r^{th}$ point; $u_j^s$ indicates an information bit calculated from the survival path; and $u_j^c$ shows an information bit calculated from the contending path.

Fifth, the first to fourth processes are iterated until the last point, that is, the $(n-1)^{th}$ point of the trellis.

Sixth, the soft decision output on the path selected as a final decoding word is a value generated by adding a polarity to the reliability.

Figure 1:
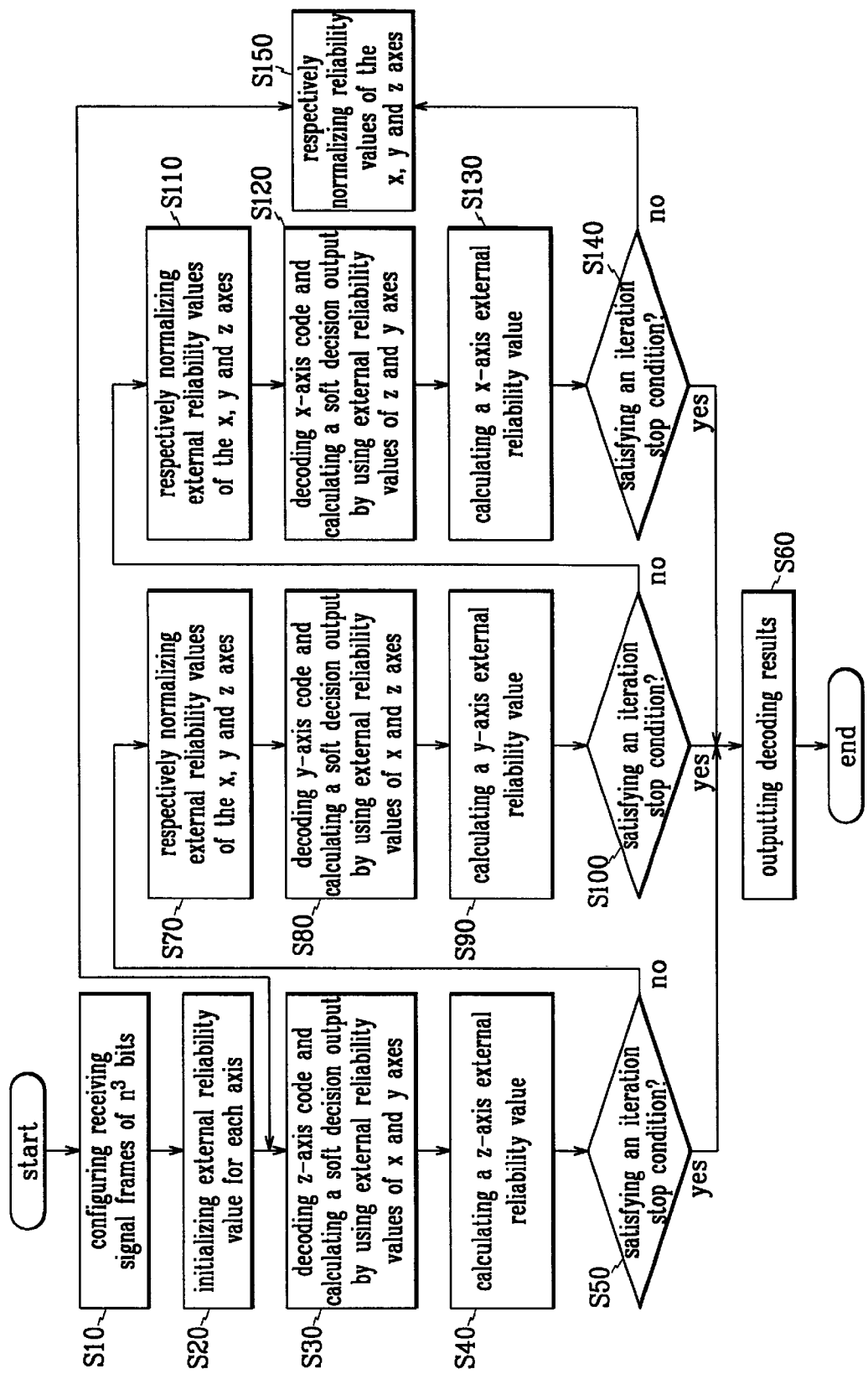
FIG. 1 shows a flowchart of an iterative decoding method for 3-dimensional block turbo codes according to a preferred embodiment of the present invention.

FIG. 1 shows a flowchart of an iterative decoding method for 3-dimensional block turbo codes according to a preferred embodiment of the present invention.

As shown, the iterative decoding method applies the SOVA and an (n,k) block code to the three-dimensional block code.

Variables described in FIG. 1 are defined as follows: external reliability information $Le(u_i)$ is used for decoding the i-axis; a soft decision output $L(u_i)'$ is generated by the i-axis decoding result; external reliability information $Le(u_i)'$ is generated by the i-axis decoding result and is used for another axis decoding; and received reliability information is $L(u)$.

Referring to FIG. 1, a transmitter configures a product code of three dimensions and transmits it in encoding frames of $n^3$ bits to a receiver, and the receiver receives the encoding frames of $n^3$ numbers and configures receiving signal frames in step S10.

A decoder in the receiver configures memories of $n^3$ units for storing external reliability for each axis with respect to the x, y, and z axis, and initializes them to zero in step S20.

First, soft decision output Viterbi decoding is performed with respect to the z axis, and as expressed in Equation 5, external reliability information $Le(u_x)'$ calculated on the x axis is added to external reliability information $Le(u_y)'$ calculated on the y axis so as to calculate external reliability information $Le(u_z)$ on the z axis.

$$Le(u_z) = Le(u_x)' + Le(u_y)' \quad \text{Equation 5}$$

Next, by using the z-axis external reliability information $Le(u_z)$, the z-axis code is decoded to calculate the soft decision output $L(u_z)'$ in step S30.

By using the z axis soft decision output $L(u_z)'$ in the previous step S30, the z axis external reliability information $Le(u_z)'$ to be used for the x and y axes is calculated according to Equation 6 in step S40.

$$Le(u_z)' = L(u_z)' - Le(u_z) - L(u) \quad \text{Equation 6}$$

In this instance, it is determined whether to satisfy a decoding iteration stop condition in step S50, and when the condition is satisfied, a corresponding decoding result is calculated in step S60, and the next receiving frame is decoded; and when the condition is not satisfied, external reliability information respectively of the x, y, and z axes is normalized in step S70, and the procedure moves to step S80 for performing soft decision output Viterbi decoding with respect to the y axis. In step S80, external reliability information $Le(u_x)'$ calculated on the x axis and external reliability information $Le(u_z)'$ calculated on the z axis is added to calculate external reliability information $Le(u_y)$ of the y axis according to Equation 7.

$$Le(u_y) = Le(u_x)' + Le(u_z)' \quad \text{Equation 7}$$

By using the y-axis external reliability information $Le(u_y)$ from Equation 7, the y axis code is decoded to calculate a soft decision output $L(u_y)'$ in step S80.

By using the y-axis soft decision output $L(u_y)'$ calculated from the previous step S80, y-axis external reliability information $Le(u_y)'$ to be used for the x and z axes is calculated according to Equation 8 in step S90.

$$Le(u_y)' = L(u_y)' - Le(u_y) - L(u) \quad \text{Equation 8}$$

In this instance, it is determined whether to satisfy a decoding iteration stop condition in step S100, and when the condition is satisfied, a corresponding decoding result is output in step S60, and the next receiving frame is decoded; and when the condition is not satisfied, external reliability information respectively of the x, y, and z axes is normalized in step S110, and the procedure moves to step S120 for performing soft decision output Viterbi decoding with respect to the x axis. In step S120, external reliability information $Le(u_y)'$ calculated on the y axis and external reliability information $Le(u_z)'$ calculated on the z axis is added to calculate external reliability information Le($u_x$) of the x axis according to Equation 9.

$$Le(u_x)=Le(u_y)'+Le(u_z)' \quad \text{Equation 9}$$

By using the x-axis external reliability information Le($u_x$) from Equation 9, the x axis code is decoded to calculate a soft decision output L($u_x$)' in step S120.

By using the x-axis soft decision output L($u_x$)' calculated from the previous step S120, x-axis external reliability information Le($u_x$)' to be used for the y and z axes is calculated according to Equation 10 in step S130.

$$Le(u_x)'=L(u_x)'-Le(u_x)-L(u) \quad \text{Equation 10}$$

In this instance, it is determined whether to satisfy a decoding iteration stop condition in step S140, and when the condition is satisfied, a corresponding decoding result is calculated in step S60, and the next receiving frame is decoded; and when the condition is not satisfied, external reliability information respectively of the x, y, and z axes is normalized in step S150, and it goes to a step S30 for performing soft decision output Viterbi decoding with respect to the z axis. These soft decision output Viterbi decoding processes of steps S30 to S150 are repeated until the iterative decoding stopping condition is satisfied.

Figure 2:
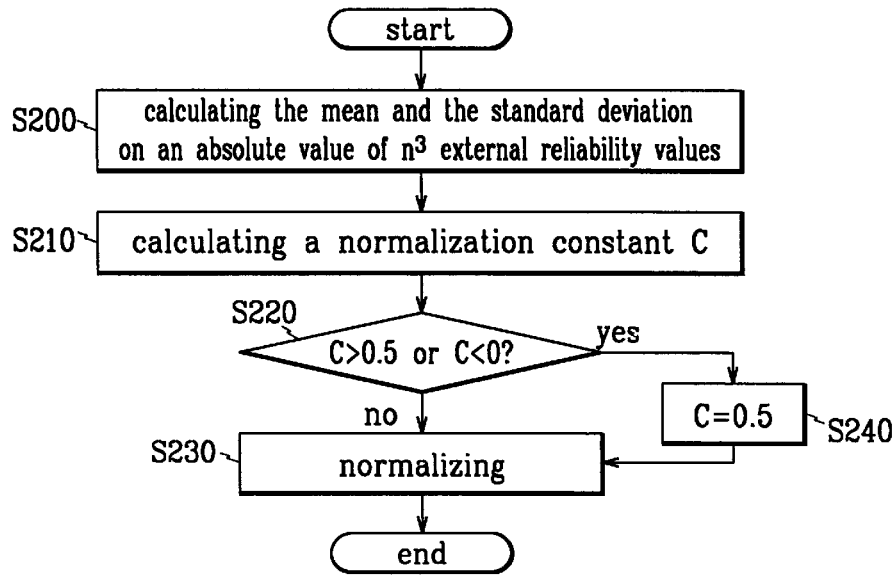
FIG. 2 shows a detailed flowchart of a normalization process with respect to each axis in an iterative decoding method for the 3-dimensional block turbo codes of FIG. 1.

FIG. 2 shows a detailed flowchart of the normalization process S70, S110 and S150 with respect to each axis in the iterative decoding method for the three dimensional block turbo codes of FIG. 1.

As shown in FIG. 2, in the normalization process S70, S110, and S150 with respect to each axis, the mean $m_{|Le(u_c)'|}$ and the standard deviation $\sigma_{Le(u_c)'}$ on the absolute values of the external reliability values Le($u_x$)', Le($u_y$)', and Le($u_z$)' with respect to the respective axes calculated from the previous steps S40, S90, and S130 are calculated in step S200.

Next, a normalization constant C is calculated according to the mean $m_{|Le(u_c)'|}$ and the standard deviation $\sigma_{Le(u_c)'}$ calculated in the previous step S200 as expressed in Equation 11 in step S210.

$$C=2m_{|Le(u_c)'|}/\sigma_{Le(u_c)'} \quad \text{Equation 11}$$

Next, it is determined whether the normalization constant C calculated in the previous step S210 is greater than 0.5 or less than 0 in step S220.

If the normalization constant C has a value between 0 and 0.5 in the previous step S220, the normalization constant C is multiplied by the external reliability values Le($u_x$)', Le($u_y$)', and Le($u_z$)' of the respective axes to perform the normalization process in step S230.

If the normalization constant C is greater than 0.5 or less than 0 in the previous step S220, the normalization constant C is fixed to be 0.5 in step S240, and the normalization process is performed in step S230.

Here, the external reliability value is limited to be 0.5 by fixing the normalization constant C to be 0.5 when the normalization constant C is greater than 0.5 in order to accelerate performance convergence in the initial iteration, and the external reliability value is also limited to be 0.5 when the normalization constant C is less than 0 in order to prevent overflow caused by calculation of the standard deviation value.

Figure 3:
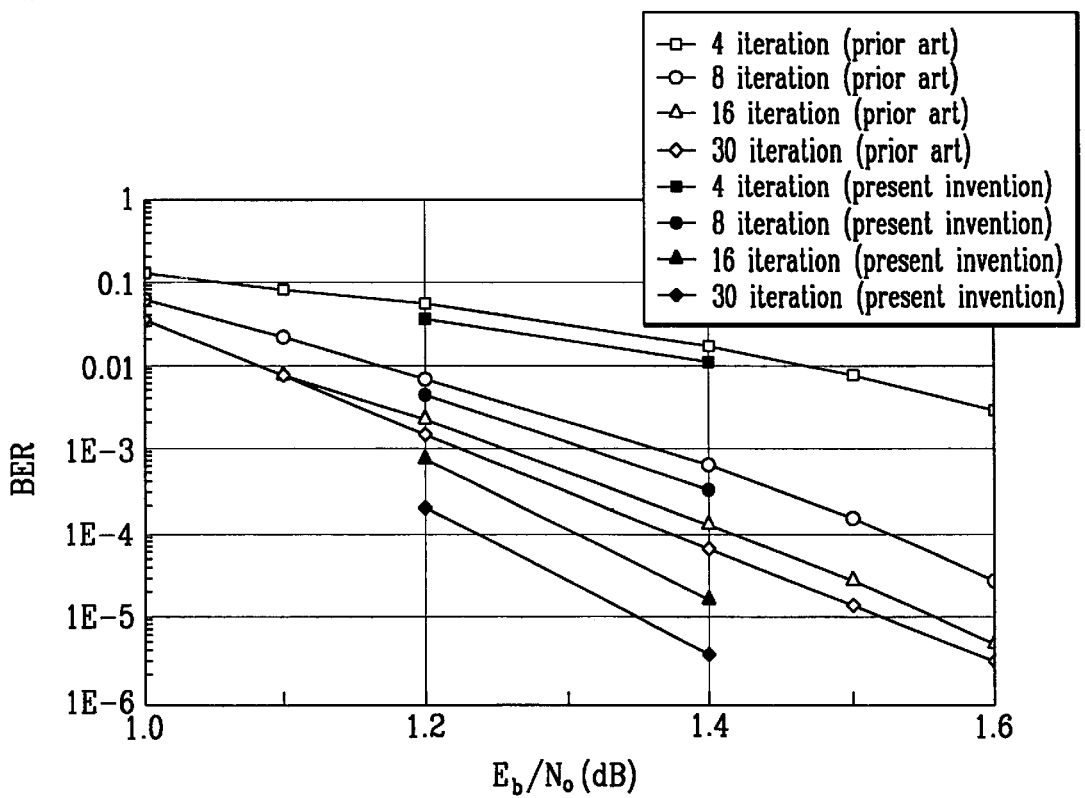
FIG. 3 shows an iterative decoding performance of the 3-dimensional block turbo codes using the (16,11) extended Bose-Chaudhuri-Hocquenghem (BCH) code.

FIG. 3 shows an iterative decoding performance when the iterative decoding method for the 3-dimensional block turbo codes using the (16,11) extended Bose-Chaudhuri-Hocquenghem (BCH) code.

As shown, compared to the case of performing the decoding using the conventional soft decision output decoding method, the present invention reduces signal-to-noise (Eb/No) ratio for maintaining an identical bit error rate (BER) thereby improving performance. In particular, the performance convergence occurs at the initial iteration very quickly.

According to the present invention, by using the soft output Viterbi decoding among iterative decoding methods on the serially concatenated product code of greater than three dimensions, iterative decoding can be easily implemented, and by concurrently using the external reliability information calculated on other axes and applying an appropriate reliability normalization method, decoding performance can be improved. Therefore, the present invention can achieve performance identical with that of the conventional method with less iteration.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. An iterative decoding method using a soft decision output Viterbi algorithm for block turbo codes using product codes wherein block codes are concatenated by greater than three dimensions, comprising:

(a) a transmitter configuring a product code of greater than three dimensions and transmitting it;

(b) configuring the signal transmitted by the transmitter into frames for decoding, and initializing external reliability information respectively corresponding to an axis corresponding to the product code of greater than three dimensions; and (c) sequentially iterating the soft decision output Viterbi algorithm decoding with respect to the respective axes, wherein (c) comprises:

(1) calculating external reliability information to be used for a predetermined axis with reference to the predetermined axis on the basis of external reliability information calculated from other axes;

(2) performing a decoding process using the external reliability information of the predetermined axis calculated in (1), and calculating soft decision output information;

(3) calculating external reliability information corresponding to the predetermined axis to be used at a next stage on the basis of the soft decision output information calculated in (2), the external reliability information of the predetermined axis calculated in (1), and the received channel reliability information;

(4) determining whether an iterative decoding stopping condition is satisfied;

(5) stopping the iteration decoding and outputting decoding results when the iterative decoding stopping condition determined in (4) is satisfied; and (6) normalizing the external reliability information of each axis when the iterative decoding stopping condition determined in (4) is not satisfied.

2. The iterative decoding method of claim 1, wherein the external reliability information Le($u_i$) to be used for the predetermined axis in (1) satisfies the following equation:

$$Le(u_i) = \sum_{j=1(j \neq i)}^{m} Le(u_j)'$$

where "m" represents the number of existing dimensions (m≧3), "i" represents the predetermined axis, and "Le(u$_j$)'" represents the external reliability information calculated from the j-axis decoding.

3. The iterative decoding method of claim 2, wherein the external reliability information Le(u$_i$)' corresponding to the predetermined axis to be used for another axis decoding to be performed after the predetermined axis decoding in (3) satisfies the following equation:

$$Le(u_i)' = L(u_i)' - Le(u_i) - L(u)$$

where "i" represents the predetermined axis, "L(u$_i$)'" represents the i-axis soft decision output information, and "L(u)" represents the received channel reliability information.

4. The iterative decoding method of claim 1, wherein (6) of normalizing the external reliability information comprises:

(A) calculating the mean and the standard deviation of absolute values of external reliability information of each axis;

(B) calculating a normalization constant on the basis of the mean and the standard deviation calculated in (A);

(C) determining whether the normalization constant calculated in (B) has a value within a predetermined range;

(D) fixing the normalization constant to be a predetermined value when the normalization constant determined in (C) does not have a value within the predetermined range; and (E) normalizing the external reliability information of each axis using the normalization constant calculated in (B) or the normalization constant fixed in (D).

5. The iterative decoding method of claim 4, wherein the normalization constant C in (B) satisfies the following equation:

$$C = 2m_{|Le(u_c)'|} / \sigma_{Le(u_c)'}$$

where "$m_{|Le(u_c)'|}$" represents the mean of absolute values of external reliability information, and "$\sigma_{Le(u_c)'}$" represents the standard deviation absolute values of external reliability information.

6. The iterative decoding method of claim 4, wherein in (C), the predetermined range is from 0 to 0.5.

7. The iterative decoding method of claim 6, wherein in (D), the normalization constant is fixed to be 0.5.

8. The iterative decoding method of claim 4, wherein in (E), the normalization of the external reliability information is performed by multiplying either the normalization constant calculated in (B) or the normalization constant fixed in (D) by the external reliability information.

9. A computer-readable recording medium for embodying programs executable by a computer for performing an iterative decoding method for block turbo codes of greater than three dimensions, the iterative decoding method comprising:

(a) a transmitter configuring a product code of greater than three dimensions and transmitting it;

(b) configuring the signal transmitted by the transmitter into frames for decoding, and initializing external reliability information respectively corresponding to axes corresponding to the product code of greater than three dimensions; and (c) sequentially iterating a soft decision output Viterbi algorithm decoding with respect to the axes, wherein (c) comprises:

(1) calculating external reliability information to be used for a predetermined axis with respect to the predetermined axis on the basis of external reliability information calculated from other axes;

(2) performing a decoding using the external reliability information of the predetermined axis calculated in (1), and calculating soft decision output information;

(3) calculating external reliability information corresponding to the predetermined axis to be used at a subsequent stage on the basis of the soft decision output information calculated in (2), external reliability information of the predetermined axis calculated in (1), and the received channel reliability information;

(4) determining whether an iterative decoding stopping condition is satisfied;

(5) stopping the iterative decoding and outputting decoding results when the iterative decoding stopping condition determined in (4) is satisfied; and (6) normalizing external reliability information of each axis when the iterative decoding stopping condition determined in (4) is not satisfied.

* * * * *